PEAK HOLDING CIRCUIT

Filed Nov. 7, 1963

*INVENTORS*
KENNETH H. MOREY
KENNETH E. PERRY
BY Robert T. Dunn
AGENT

United States Patent Office 3,259,760
Patented July 5, 1966

3,259,760
PEAK HOLDING CIRCUIT
Kenneth H. Morey, Framingham, and Kenneth E. Perry, Arlington, Mass., assignors to Massachusetts Institute of Technology, Cambridge, Mass., a corporation of Massachusetts
Filed Nov. 7, 1963, Ser. No. 322,244
8 Claims. (Cl. 307—88.5)

This invention relates to peak holding circuits and more particularly to a circuit for producing a signal representative of the extreme excursions of an input signal.

Heretofore circuits for producing a signal representative of the extreme excursions of one polarity of an input signal have included a capacitor charged through a diode by the input signal. The charge on the capacitance at any instance represents the maximum excursion of a given polarity of the input signal since initiation of operation. These circuits are frequently unsatisfactory for a number of reasons. First, the forward voltage drop of thte diode is about a tenth of a volt and must be overcome before a change in the stored voltage can occur, thus, the sensitivity of the circuit is limited to about a tenth of a volt and dynamic operating range is limited. Secondly, the output impedance of the circuit must be high to prevent discharge of the capacitance when the output is detected. It is one object of the present invention to provide a peak holding circuit in which these limitations are avoided.

It is another object of the present invention to provide a peak holding circuit responsive to input signals as small as a few millivolts and reasonably accurate over a 60 db dynamic range.

It is another object of the present invention to provide a peak holding circuit capable of storing signal level for a relatively substantial period of time and capable of providing sufficient output power for driving a load which does not deplete the stored signal.

It is a feature of the present invention to employ a negative feedback amplifier with a peak holding circuit in the feedback loop including a capacitance as the storage element which is isolated from the feedback impedance in the loop and in which the potential across the feedback impedance is representative of a peak signal stored by the capacitance.

It is another feature of the present invention to employ a feedback amplifier with two unidirectional feedback loops conductive in opposite directions. At least one loop includes a signal storage element for controlling loop current, which is representative of extreme excursions of an input signal applied to the amplifier.

Embodiments of the invention employ an operational amplifier to which the input signal is applied. Amplifier feedback is accomplished through two feedback circuits, one having a diode electrically directed toward the input and the other having a diode electrically directed away from the input. The peak signal storage circuit includes a capacitance charged through one of these diodes and in turn controlling a non-phase reversing signal gain device, such as a cathode follower or emitter follower transistor, which provides a feedback current to the input of the amplifier of opposite sign to input current. As a result, the output of tthe amplifier is of the same polarity as the input signal and so the diode charging the capacitance remains back biased until an input signal arrives which provides a current to the input of the amplifier of greater absolute magnitude than this feedback current. When this occurs, the polarity of the output of the amplifier switches, the charging diode is forward biased and the charge on the capacitance is altered as required to match the new input signal peak.

Other features and objects of the invention will be apparent from the following specific description taken in conjunction with the figures in which.

Figure 1:
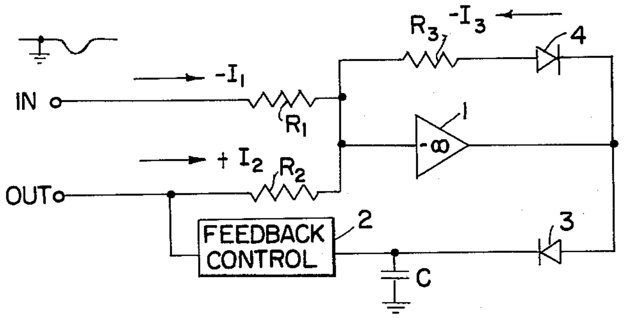
FIGURE 1 illustrates a peak holding circuit for detecting maximum negative execursions of an input signal.
Figure 2:
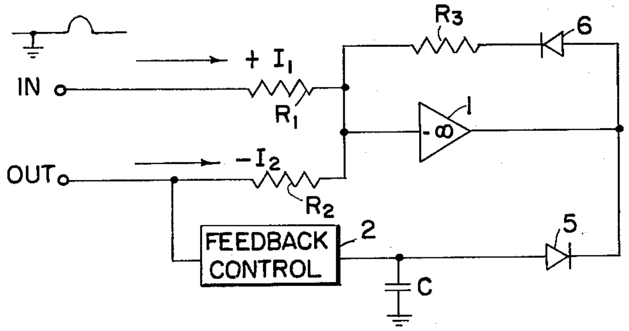
FIGURE 2 illustrates a similar circuit for detecting maximum positive excursions of an input signal.

Turning first to FIGURES 1 and 2 there are shown two variations of the present invention, one for detecting and holding peak values of negative excursions of an input signal and the other for holding peak values of positive excursions of an input signal. These circuits are identical insofar as each includes a high gain amplifier circuit 1, an input impedance $R_1$, two feedback loops, one including an impedance $R_3$ and another including an impedance $R_2$, and a storing capacitance C which holds a voltage indicative of extreme excursions of input signals applied to impedance $R_1$. The system in FIGURE 1 is intended to peak hold maximum negative excursions of the input signal during which time a negative current $-I_1$ is applied through impedance $R_1$ to the input of the amplifier 1. When this occurs a feedback current $+I_2$ must be drawn through impedance $R_2$ to null the input to the amplifier. This feedback current $+I_2$ is provided from a feedback control 2. If the feedback current $+I_2$ is not of sufficient magnitude to null the input current $-I_1$, then the output of the amplifier 1 will swing positive and the capacitance C will be charged through the diode 3. On the other hand, if the feedback current through $R_2$ is of greater absolute magnitude than the input current through $R_1$ then the output of the amplifier will swing negative and an additional feedback current, $-I_3$, will be supplied to the input through diode 4 and impedance $R_3$ to null the input. Thus, the operation of the amplifier 1 with its feedback loops is similar to the well known operation of such amplifiers, however, the absolute magnitude of the portion of the feedback current which is controlled by the charge stored on capacitance C is always greater than or equal to the absolute magnitude of current supplied by the input signal and is, in fact, proportional to the greatest excursion of the input signal since initiation of operation.

The feedback control 2 is a non-phase reversing gain device, herein referred to as a positive gain device, and provides a current to the input of the amplifier which is equal to the input current from an input signal of a magnitude represented by the charge on the capacitance C. This control may be a cathode follower, an emitter follower, an operational amplifier or any other device capable of supplying a current proportional to a control voltage applied thereto. The relative values of the impedances $R_1$, $R_2$, $R_3$ and the gain of the feedback control 2 may be set at any suitable values which result in the above operation. Where, for example, the ratio of peak input to output voltage is unity, $R_1$, $R_2$, and $R_3$ are preferably equal and the gain of feedback control 2 is unity.

FIGURE 2 illustrates a use of the invention for detecting and holding a voltage proportional to the maximum positive excursion of an input signal. In this case, the diodes 5 and 6 in the feedback circuits are electrically directed oppositely to their equivalents in FIGURE 1. Thus, the feedback control 2 provides a feedback current through impedance $R_2$ to null the positive input current from the input signal and the output signal level is of negative polarity.

Figure 3:
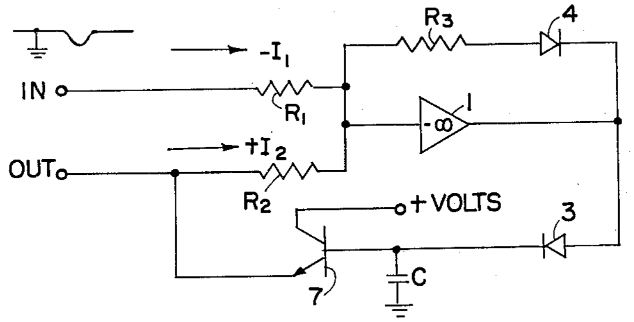
FIGURE 3 illustrates an embodiment of the invention employing an emitter follower transistor in the feedback loop wherein the output of the transistor is indicative of the stored signal.
Figure 4:
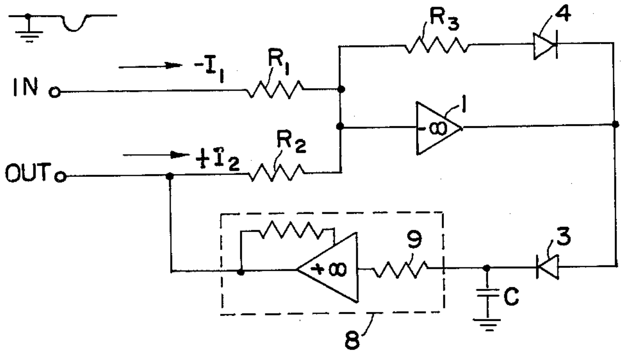
FIGURE 4 illustrates another embodiment of the invention in which a second feedback amplifier is used in the feedback loop for controlling the current in the loop.

FIGURES 3 and 4 illustrate embodiments of the basic circuit including different types of feedback control circuits. In FIGURE 3, for example, the feedback control circuit includes an emitter follower 7 with base coupled to the capacitance C. In FIGURE 4, the feedback control circuit is a positive gain operational amplifier 8, to which an input is provided through high impedance 9 from the capacitance C.

This completes description of a few embodiments of the present invention wherein a storage device is charged by a feedback amplifier in response to input signals, at least part of the feedback to the amplifier being controlled by the storage device and representing maximum excursions of the input signal. While specific embodiments of this invention are described, it should be clearly understood they are made only by way of example and do not limit the spirit and scope of the invention as set forth in the accompanying claims.

We claim:

1. A signal detecting circuit for holding peak values of an input signal comprising amplifying means having an input responsive to said input signal and producing an output, means coupled to the output of said amplifying means for storing signals of only one polarity, means responsive to said storing means for providing feedback to the input of said amplifying means and means for coupling signals of a polarity opposite said one polarity from said output to said input.

2. A peak holding circuit for holding peak values of an input signal comprising amplifying means having an input responsive to said input signal and producing an output, signal storing means, first unidirectionally conductive means coupling the output of said amplifying means to said storing means, means responsive to said storing means for providing feedback to the input of said amplifying means and second unidirectionally conductive means coupling said output and input electrically directed oppositely to said first unidirectionally conductive means.

3. A peak holding circuit for holding peak values of an input signal comprising amplifying means having an input responsive to said input signal and producing an output, signal storing means, first unidirectionally conductive means coupling the output of said amplifying means to said storing means, means responsive to said storing means for providing feedback current to the input of said amplifying means representative of peak excursions of said input signal and second unidirectionally conductive means coupling said output and input electrically directed oppositely to said first unidirectionally conductive means.

4. A peak holding circuit for holding peak values of an input signal comprising means for amplifying having an input and output, means for coupling at least one input signal to said amplifying means, feedback means between the output and input of said amplifying means, said feedback means including a storing capacitance, a first unidirectionally conductive circuit for charging said capacitance in response to signal excursions of one polarity in output of said amplifying means, means controlled by said capacitance for providing feedback to the input of said amplifying means and a second unidirectionally conductive circuit coupling said output and input for conducting signals of another polarity from said output to said input.

5. A peak holding circuit for holding peak values of an input signal comprising a feedback amplifier having a plurality of electrically oppositely directed feedback loops coupling output and input thereof and means coupling said input signal to the input of said amplifying means, at least one of said feedback loops including a signal storing capacitance charged through a diode by the output of the amplifier, said capacitance serving to control current through a feedback impedance to the input of the amplifier, the potential across said feedback impedance being representative of peak excursions of said input signal.

6. A peak holding circuit for holding peak values of an input signal comprising a feedback amplifier having at least two electrically oppositely directed unidirectionally conductive feedback loops coupling output and input thereof and means coupling said input signal to the input of said amplifying means, at least one of said feedback loops including means for storing the output of said amplifier and providing feedback current to said amplifier input, said storing means controlling said feedback current through a feedback impedance to the input of said amplifier, the potential across the feedback impedance being representative of peak excursions of said input signal whereby the absolute magnitude of said feedback current is at least as great as the absolute magnitude of an input current due to said input signal and is proportional to the greatest excursion of said input signal.

7. A peak holding circuit comprising
a source of input signals,
a phase reversing amplifier having an input and an output,
means for coupling said input signals to the input of said amplifier,
a first feedback circuit coupling said output and said input for conducting signals of only one polarity from said output to said input,
a second feedback circuit coupling said output and said input responsive to signals at said output of a polarity opposite to said one polarity, and
signal storage means in said second feedback circuit,
whereby said second feedback circuit produces signals at said input representative of peak excursions of said input signal of said one polarity.

8. A peak holding circuit comprising
a source of input signals,
a phase reversing amplifier having an input and an output,
means for coupling said input signals to the input of said amplifier,
a first feedback circuit coupling said output and said input for conducting signals of only one polarity from said output to said input,
a second feedback circuit coupling said output and said input responsive only to signals at said output of a polarity opposite to said one polarity,
signal storage means in said second feedback circuit and
non-phase reversing amplifying means in said second feedback circuit responsive to said signal storage means,
whereby said second feedback circuit produces signals at said input representative of peak excursions of said input signal of said one polarity.

References Cited by the Examiner

UNITED STATES PATENTS

| | | | |
|---|---|---|---|
| 2,244,240 | 6/1941 | Blumlein | 328—172 X |
| 3,119,984 | 1/1964 | Brandt et al. | 328—151 X |
| 3,158,759 | 11/1964 | Jasper | 307—88.5 |

FOREIGN PATENTS

| | | |
|---|---|---|
| 221,041 | 7/1958 | Australia. |

OTHER REFERENCES

Analog Methods in Computation and Simulation, by W. W. Soroka, McGraw-Hill Book Co., Inc., 1954 (page 205).

ARTHUR GAUSS, *Primary Examiner.*

J. ZAZWORSKY, *Assistant Examiner.*